(12) United States Patent
Tzeng et al.

(10) Patent No.: US 7,605,413 B2
(45) Date of Patent: Oct. 20, 2009

(54) HIGH VOLTAGE DEVICES

(75) Inventors: Jiann-Tyng Tzeng, Hsinchu (TW); Li-Huan Zhu, Hsinchu (TW)

(73) Assignee: Taiwan Seminconductor Manufacturing Co., Ltd., Hsin-Chu (TW)

( * ) Notice: Subject to any disclaimer, the term of this patent is extended or adjusted under 35 U.S.C. 154(b) by 125 days.

(21) Appl. No.: 11/424,604

(22) Filed: Jun. 16, 2006

(65) Prior Publication Data

US 2007/0290291 A1 Dec. 20, 2007

(51) Int. Cl.
*H01L 29/78* (2006.01)
(52) U.S. Cl. ............................ 257/286; 257/E29.299
(58) Field of Classification Search ........................ None
See application file for complete search history.

(56) References Cited

U.S. PATENT DOCUMENTS

| | | | |
|---|---|---|---|
| H1435 H * | 5/1995 | Cherne et al. ............... | 257/347 |
| 6,333,520 B1 * | 12/2001 | Inoue ........................... | 257/72 |
| 6,583,474 B2 * | 6/2003 | Yamazaki et al. ........... | 257/354 |
| 6,611,027 B2 * | 8/2003 | Ichikawa ..................... | 257/355 |
| 6,815,765 B2 * | 11/2004 | Arima ......................... | 257/327 |
| 6,847,065 B1 * | 1/2005 | Lum ........................... | 257/221 |
| 2004/0211983 A1 | 10/2004 | Tien et al. | |
| 2006/0091503 A1 * | 5/2006 | Wu et al. ..................... | 257/640 |

OTHER PUBLICATIONS

CN Office Action mailed Jul. 4, 2008.

* cited by examiner

*Primary Examiner*—Sue Purvis
*Assistant Examiner*—Benjamin P Sandvik
(74) *Attorney, Agent, or Firm*—Thomas, Kayden, Horstemeyer & Risley

(57) ABSTRACT

High voltage devices capable of preventing leakage current caused by inversion layer. In the high voltage device, a substrate comprises an active area formed therein, a source region and a drain region formed in the substrate, and a gate structure is formed on the active area to define a channel region in the substrate between the drain region and the source region, wherein the active area has at least one side extending along a direction perpendicular to the channel direction of the channel region, such that the gate structure without completely covering the extension.

14 Claims, 5 Drawing Sheets

HIGH VOLTAGE DEVICES

BACKGROUND OF THE INVENTION

1. Field of the Invention

The invention relates to high voltage devices, and in particular to high voltage devices capable of preventing leakage current caused by inversion layer.

2. Description of the Related Art

A high voltage device is one of the most important devices utilized in highly integrated circuits and is a device that can sustain a higher voltage this is applied thereto. In general, the break down voltage of a high voltage device is higher than a regular device. For example, a regular device has an operating voltage range of about 5V, and a high voltage device has an operating voltage range from 40V~100V. Typically, the high voltage device has a structure similar to that of a MOSFET. Erasable programmable read only memory (EPROM) and flash memory are two high voltage devices most often used in computers and electronics products.

FIG. 1A shows a conventional high voltage device, and FIG. 1B is a cross section of the high voltage device shown in FIG. 1A along the line AA'. As shown in FIG. 1A, a high voltage device 10 is formed on the substrate 12, in which isolation (STI) structure 14 defines active area (AA) 16, and poly gate structure 18 is disposed on the isolation structure 14 and the active area 16. As the poly gate structure 18 covers the isolation structure 14, inversion layer is induced at the edges of the active area 16 after a high temperature stress, conducting leakage current Ioff.

BRIEF SUMMARY OF THE INVENTION

A detailed description is given in the following embodiments with reference to the accompanying drawings.

Embodiments of high voltage devices are disclosed, in which a substrate comprises an active area formed therein, a source region and a drain region formed in the substrate, and a gate structure is formed on the active area to define a channel region in the substrate between the drain region and the source region, wherein the active area has at least one side extending along a direction perpendicular to the channel direction of the channel region, such that the gate structure without completely covering the extension.

Embodiments of high voltage devices are disclosed, in which a substrate comprises an active area formed therein, a source region and a drain region formed in the substrate, and a gate structure is formed on the active area to define a channel region in the substrate between the drain region and the source region, wherein the active area has at least one side extending along a direction perpendicular to the channel direction of the channel region, such that the gate structure without completely covering the active area.

The invention also discloses embodiments of a fabrication method of high voltage devices, in which a substrate is provided, and an active area with at least one extension is defined in the substrate, in which the extension extends from the active area. A gate structure is formed on the substrate to define a change region in the active area, wherein the extension extends along a direction perpendicular to a channel direction of the channel region, such that the gate structure without completely covering the extension.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1A:
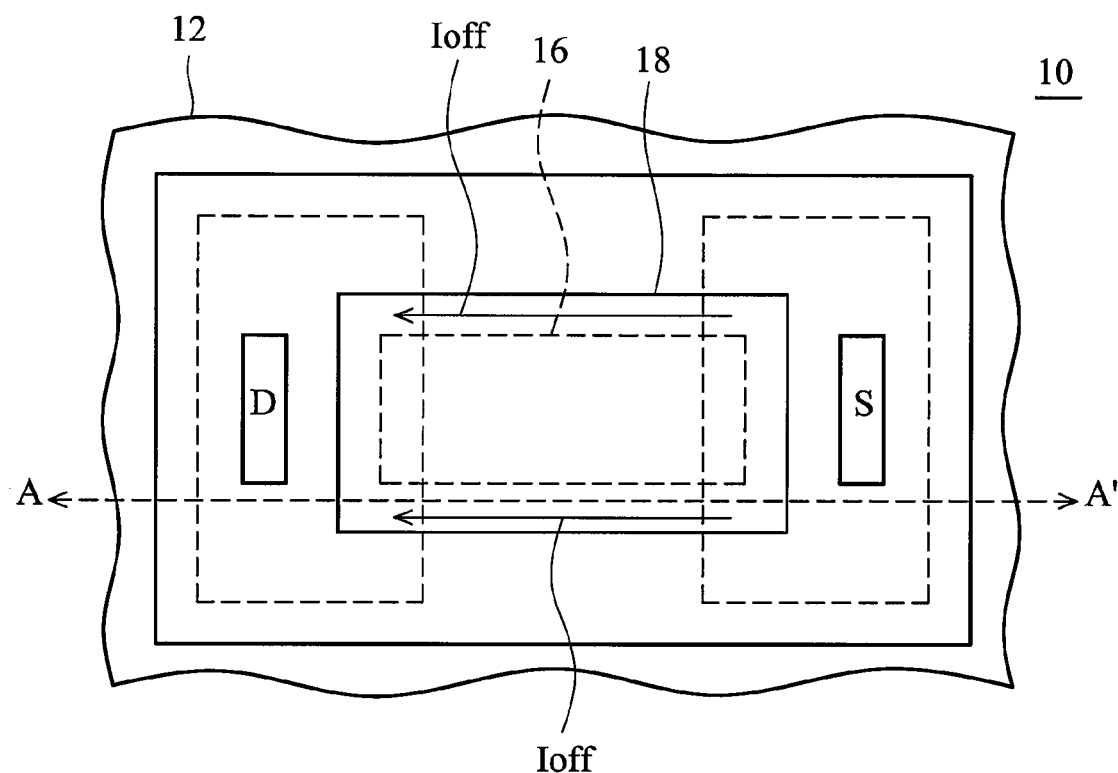
FIG. 1A is a plane view of a conventional high voltage device.
Figure 1B:
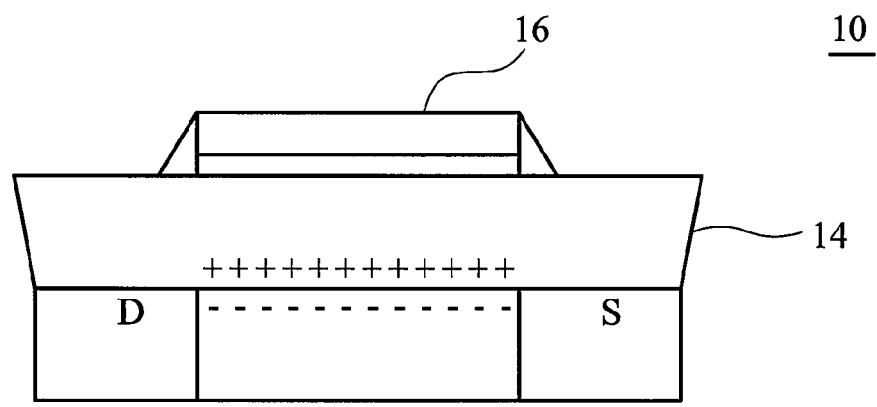
FIG. 1B is a cross section of the high voltage device shown in FIG. 1A along the line AA'.

In conventional high voltage devices shown in FIGS. 1A and 1B, the conducting leakage current Ioff is conducted by the inversion layer at the edges of the active area after high temperature stress. The root cause is that positive charge within the shallow trench isolation structure was pushed to the button thereof, and the induced inversion layer conducts the leakage current due to poor field isolation. Thus, the invention cuts off the inversion layer to solve such problem.

Figure 2A:
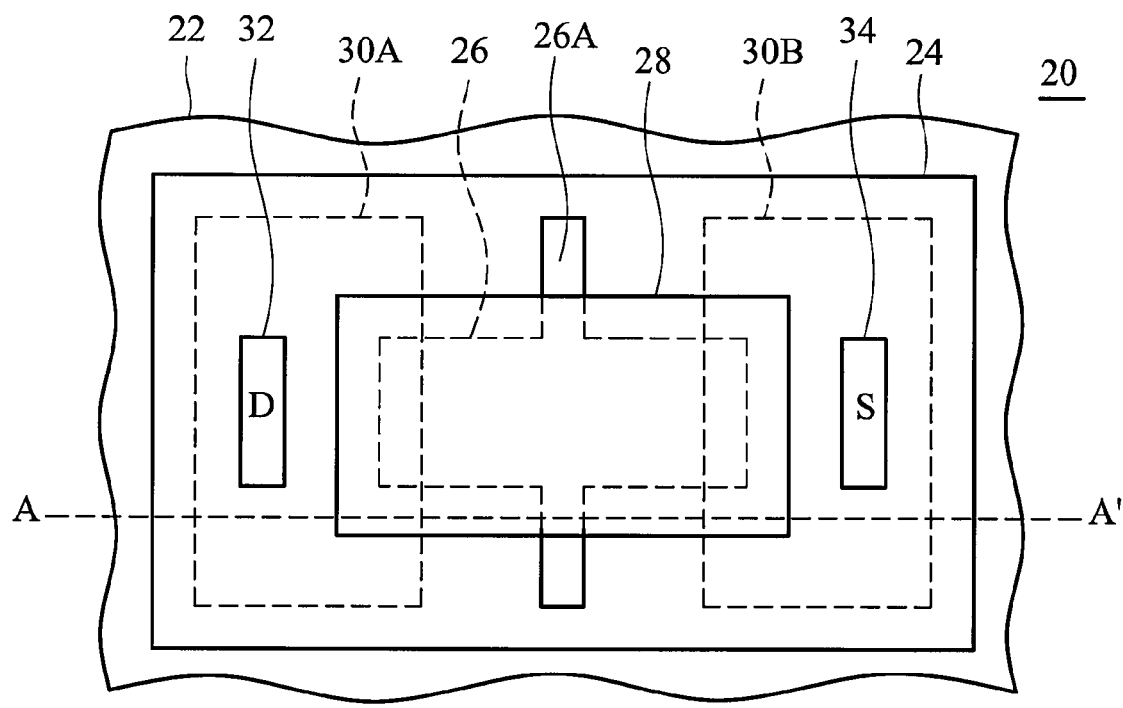
FIG. 2A is a plane view of a high voltage device in accordance with one embodiment of the invention.
Figure 2B:
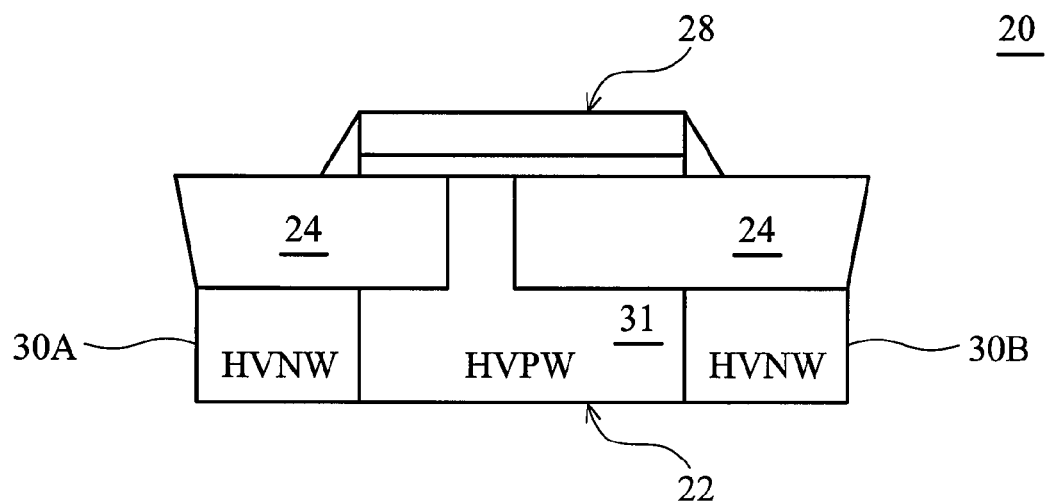
FIG. 2B is a cross section of the high voltage device shown in FIG. 2A along the line AA'.

FIG. 2A is a plane view of a high voltage device in accordance with one embodiment of the invention, FIG. 2B is a cross section of the high voltage device shown in FIG. 2A along the line AA', and FIG. 2C is a cross section of the high voltage device shown in FIG. 2A along the line BB'.

As shown in FIG. 2A, the high voltage (HV) device 20 is a HV symmetric NMOS transistor. The HV device 20 comprises substrate 22 with an active 26, a drain region 32 and a source region 34, and a gate structure 28. The substrate 22 comprises two N-type well regions 30A and 30B and a P-type well region 31 (shown in FIG. 2B) disposed therebetween, in which the drain region 32 and the source region 34 are formed in the two N-type well regions 30A and 30B respectively, and the active area is formed in the well regions 30A, 30B and 31. The gate structure 28 is formed to the active area 26 define a channel region (not shown) in the substrate 22 between the drain region 32 and the source region 34. In this case, the high voltage device 20 is a HV symmetric NMOS transistor, but it is to be understood that the invention is not limited thereto. For example, the high voltage device 20 can also be a HV asymmetrical NMOS transistor, a HV symmetric PMOS transistor or a HV asymmetrical PMOS transistor.

The active area 26 is delimited in the substrate 22 by an isolation structure 24, such as shallow trench isolation structure, field oxide and the like. The active area 26 has two extensions 26A extending along a direction perpendicular to the channel direction of the channel region, such that the gate structure 28 does not completely cover the extensions 26A. As shown in FIG. 2A, the extensions 26A are symmetrically formed on both sides of the active area 26. In the invention, the channel direction is the direction from the drain region 32 to the source region 34 or the source region 34 to the drain region 32, for example the horizontal direction of FIG. 2A. Namely, the two extensions 26A extend along the vertical direction of FIG. 2A (perpendicular to the line AA'). Thus, the isolation structure 24 at the edges of the gate structure 28 is separated by the extensions 26A, as shown in FIG. 2B.

As the isolation structure 24 at the edges of the gate structure 28 is separated by the extensions 26A, inversion layer induced at the edges of the gate structure 28 after high temperature stress can be cut off, and thus, leakage can be prevented. Namely, the invention can cut off the inversion layer induced by the positive charges in the isolation structure 24 after bias temperature stress, thereby preventing leakage current caused by inversion layer.

Figure 3A:
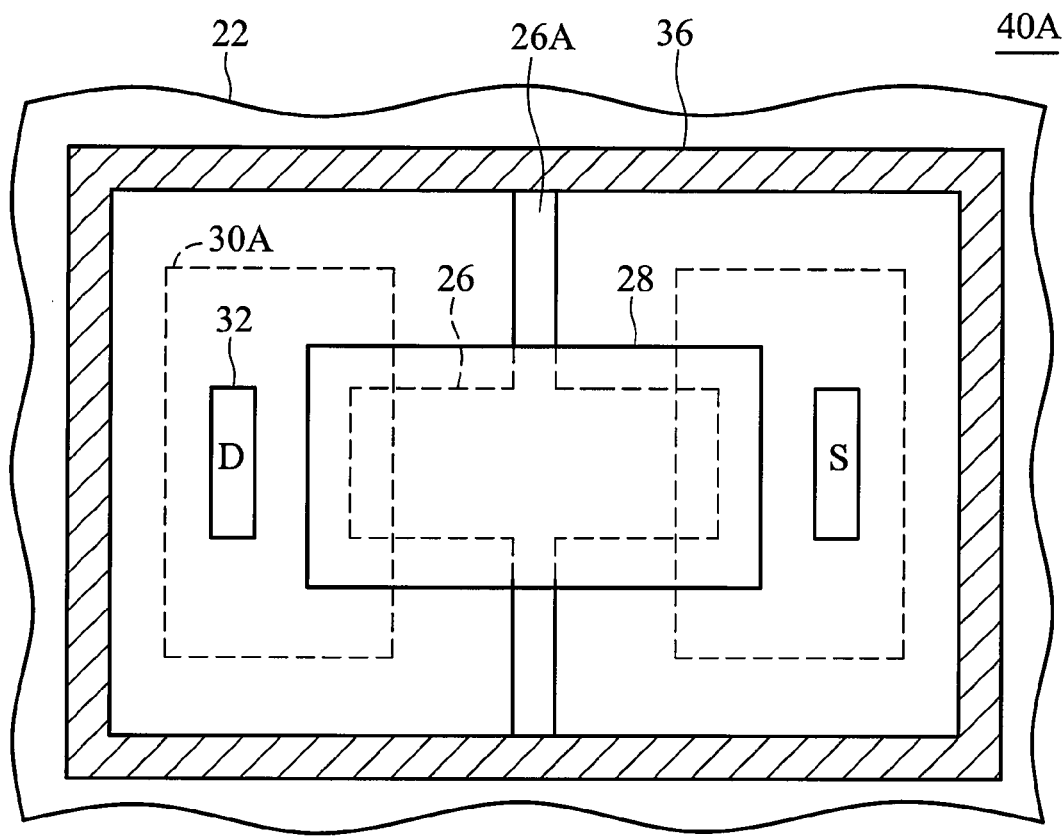
FIG. 3A shows another embodiment of high voltage device of the invention.

FIG. 3A shows another embodiment of high voltage device of the invention. As shown in FIG. 3A, the high voltage device 40A is similar to the high voltage device 20 shown in FIG. 2A except for a pick-up region 36. In the high voltage device 40A, the pick-up region 36 surrounds the active 26, the drain region 32 and the source region 34, and the gate structure 28. Further, the extensions 26A extend to the pick-up region 36 to prevent inversion layer induced by process.

Figure 3B:
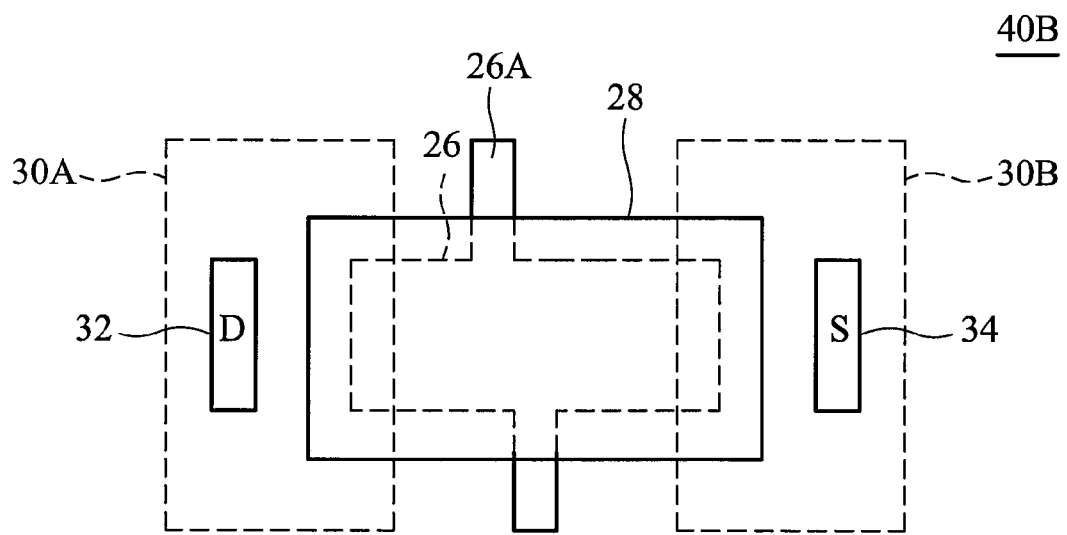
FIG. 3B shows another embodiment of high voltage device of the invention.

FIG. 3B shows another embodiment of high voltage device of the invention. As shown in FIG. 3B, the high voltage device 40B is similar to the high voltage device 20 shown in FIG. 2A except for the extensions 26A. In the high voltage device 40B, the extensions 26A are asymmetrically formed on both sides of the active area 26 to separate the isolation structure 24 at the edges of the gate structure 28, thereby cutting off the inversion layer induced by the positive charges in the isolation structure 24 after bias temperature stress.

Figure 3C:
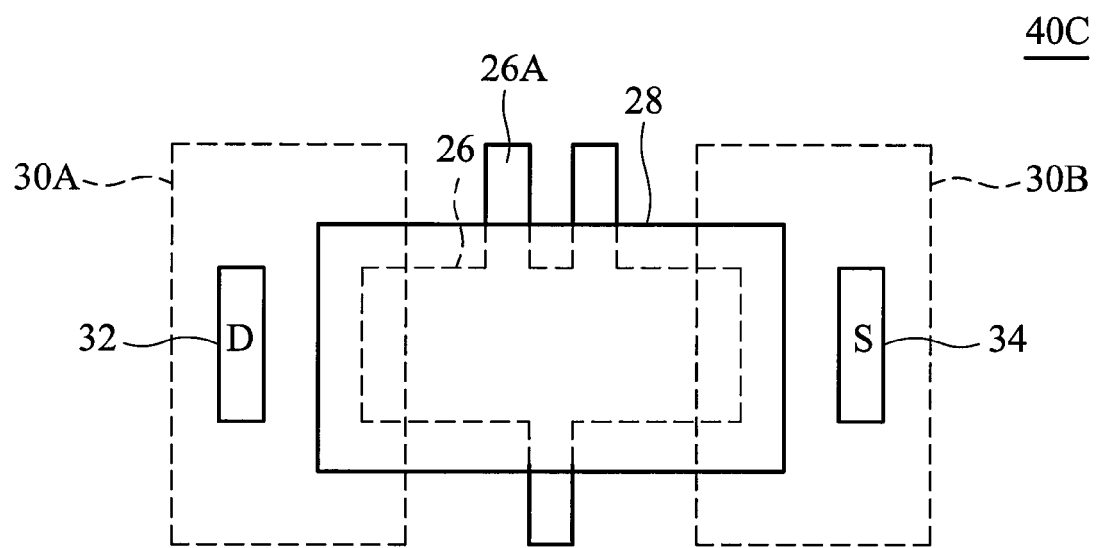
FIG. 3C shows another embodiment of high voltage device of the invention.

FIG. 3C shows another embodiment of high voltage device of the invention. As shown in FIG. 3C, the high voltage device 40C is similar to the high voltage device 20 shown in FIG. 2A except for the extensions 26A. In the high voltage device 40B, two extensions 26A are formed on one side of the active area 26 and one extension 26A is formed on the other side of the active area 26, such that the isolation structure 24 at the edges of the gate structure 28 is separated by extensions 26A, and thus, the inversion layer induced by the positive charges in the isolation structure 24 after bias temperature stress can be cut off.

Figure 3D:
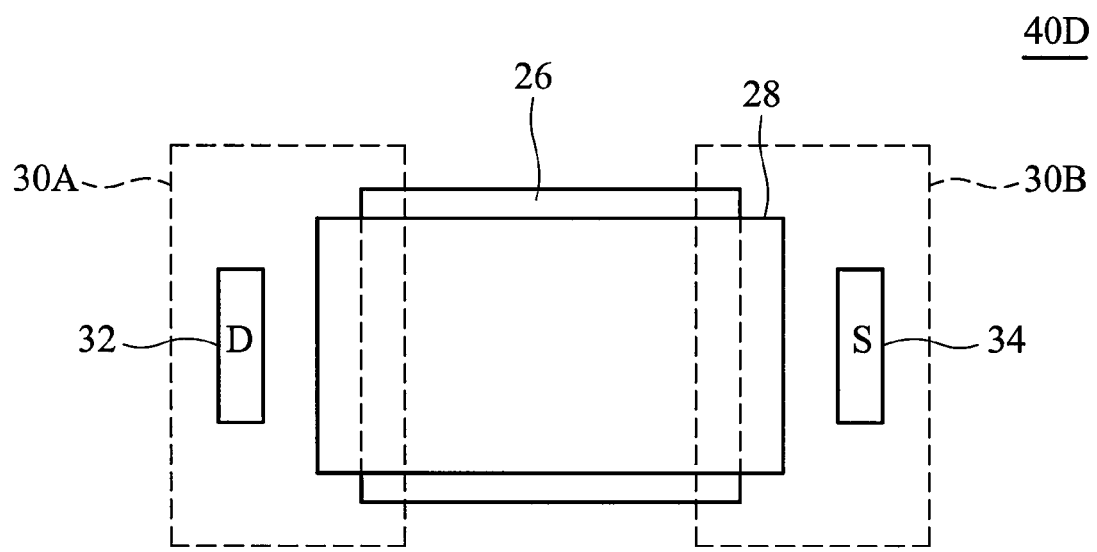
FIG. 3D shows another embodiment of high voltage device of the invention.

FIG. 3D shows another embodiment of high voltage device of the invention. As shown in FIG. 3D, the high voltage device 40D is similar to the high voltage device 20 shown in FIG. 2A except for the active area 26. In the high voltage device 40B, the active area 26 has two sides extending along a direction perpendicular to the channel direction of the channel region, such that the gate structure without completely covering the active area 26. Namely, the active has two sides extending along the vertical direction of FIG. 4D, such that the isolation structure 24 at the edges of the gate structure 28 is separated by active area 26, and thus, the inversion layer induced by the positive charges in the isolation structure 24 after bias temperature stress can be cut off.

Figure 3E:
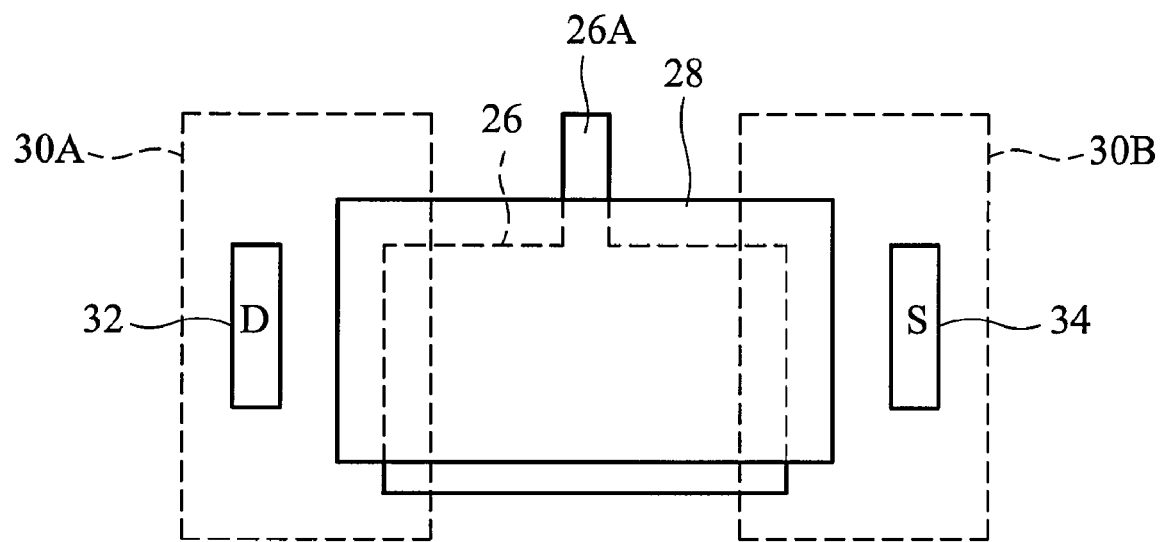
FIG. 3E shows another embodiment of high voltage device of the invention.

FIG. 3E shows another embodiment of high voltage device of the invention. As shown in FIG. 3E, the high voltage device 40E is similar to the high voltage device 20 shown in FIG. 3D except for the extension 26A. In the high voltage device 40B, one extension 26A is formed on upper side of the active area 26, such that the isolation structure 24 at the edges of the gate structure 28 is separated by the extension 26A and the lower side of the active area 26, and thus, the inversion layer induced by the positive charges in the isolation structure 24 after bias temperature stress can be cut off. In those embodiments, the extensions are rectangular, but it is to be understood that the invention is not limited thereto. For example, the extensions can also be triangular or polygonal.

The invention also discloses embodiments of a fabrication method of high voltage devices.

A substrate 22, such as a silicon substrate or other semiconductor substrate, with two first well regions 30A of a first conductivity type and a second well region 31 of a second conductivity type is provided.

An active area 26 with at least one extension 26A is defined in the substrate 22, in which the extension 26A extends from the active area 26. For example, the isolation structure 24 is formed within the substrate 22 by conventional isolation technology. The isolation structure 24 can be field oxide (FOX) formed by shallow trench isolation (STI) or local oxidation of silicon (LOCOS), wherein STI is preferable. As a result, the active area 26 with at least one extension 26A is defined on the substrate 22, and two regions (not shown) forming drain and source regions are defined in the well regions 30A and 30B simultaneously. Additionally, prior to the described step, various ion implantations and annealing processes may be performed to formed desired well regions 30A, 30B and 31 within the substrate 22, and is omitted for simplification.

As shown in FIG. 2A, the active area 26 can have two extensions 26A on both sides of the active area 26, in which the two extensions 26A are symmetrically formed on both sides of the active area 26. The extensions 26A can also be extended to the pick-up region 36 to prevent inversion layer induced by process, as shown in FIG. 3A. The extensions 26A can also asymmetrically formed on both side of the active area 26A, as shown in FIG. 3B. Alternately, the active area 26 can also have one single extension 26A on one side and two extensions 26A on the other side of the active area 26, as shown in FIG. 3C.

Next, a gate structure 28 is formed on the substrate 22 to define a change region (not shown) in the active area 26 by conventional process technology. For example, the gate structure 26 can comprise a gate oxide layer, a poly gate layer, two side walls, and the likes. Finally, the two regions defined in the well regions 30A and 30B are doped to form a drain region and a source region by conventional process technology.

The extension 26A extends along a direction perpendicular to a channel direction of the channel region, such that the gate structure 26 does not completely cover the extension 26A. In the invention, the channel direction is the direction from the drain region 32 to the source region 34 or the source region 34 to the drain region 32, for example the horizontal direction of FIG. 2A. Namely, the two extensions 26A extend along the vertical direction of the FIG. 2A (perpendicular to the line AA'). Thus, the isolation structure 24 at the edges of the gate structure 28 is separated by the extensions 26A, as shown in FIG. 2B.

As the isolation structure 24 at the edges of the gate structure 28 is separated by the extensions 26A, inversion layer induced at the edges of the gate structure 28 after high temperature stress can be cut off, and thus, leakage can be prevented. Namely, the invention can cut off the inversion layer induced by the positive charges in the isolation structure 24 after bias temperature stress, thereby preventing leakage current caused by inversion layer.

In some examples of the invention, the active area 26 can also be from as like FIG. 3D, the active area 26 has two sides extending along a direction perpendicular to the channel direction of the channel region, such that the gate structure does not completely cover the active area 26. Alternately, the active area 26 can also be from as like FIG. 3E, the active area 26 has one extension 26A on one side, and the extension 26A and the other side of the active area 26 are extended along a direction perpendicular to the channel direction of the channel region, such that the gate structure does not completely cover the active area 26. In those embodiments, the extensions are rectangular, but it is to be understood that the invention is not limited thereto. For example, the extensions can also be triangular or polygonal.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A high voltage device, comprising:
    a substrate comprising an active area of a first conductive type formed therein;
    a source region and a drain region of a second conductive type formed in the substrate, and
    a gate structure formed on the active area to define a channel region in the substrate between the drain region and the source region and having a longitudinal axis substantially parallel to the channel direction, wherein the active area has at least one extension extending along a first direction perpendicular to the channel direction of the channel region, the active area is within the gate structure and the at least one extension has a first portion which is exposed from the gate structure and a second portion which is not exposed, and the at least one extension has a width, the width is parallel to the channel direction and is shorter than the channel region.

2. The high voltage device as claimed in claim 1, wherein the high voltage device is a MOS transistor.

3. The high voltage device as claimed in claim 1, wherein the at least one extension extends to a pick-up region formed in the substrate from the active area.

4. The high voltage device as claimed in claim 1, wherein the substrate further comprises two first well regions of the second conductivity type and a second well region of the first conductivity type formed in the substrate, in which the drain and source regions are formed within the two first well regions respectively and the active area and the at least one extension are formed within the second well region.

5. The high voltage device as claimed in claim 1, wherein the at least one extension is formed on both sides of the active area.

6. The high voltage device as claimed in claim 5, wherein the at least one extension is symmetrically formed on both sides of the active area.

7. The high voltage device as claimed in claim 5, wherein the at least one extension is asymmetrically formed on both sides of the active area.

8. The high voltage device as claimed in claim 1, wherein the at least one extension has a shape of rectangular, triangular or polygonal.

9. The high voltage device as claimed in claim 1, wherein the device is formed by a fabrication method, the method comprising:
    providing a substrate comprising two first well regions of a first conductivity type and a second well region of a second conductivity type;
    defining an active area with at least one extension in the second well region of the substrate; and
    forming a gate structure on the substrate to define a channel region in the active area, wherein the at least one extension extends along a first direction perpendicular to a channel direction of the channel region, the gate structure has a longitudinal axis substantially parallel to the channel direction, the active area is within the gate structure and the extension has a first portion which is exposed from the gate structure and a second portion which is not exposed, and the at least one extension has a width, the width is parallel to the channel direction and is shorter than the channel region.

10. The high voltage device as claimed in claim 9, further comprising forming a source region and a drain region formed within the two first well regions respectively.

11. The high voltage device as claimed in claim 9, further comprising forming a pick-up region in the substrate, wherein the at least one extension extends to the pick-up region.

12. A high voltage device, comprising:
    a substrate comprising an active area of a first conductive type formed therein;
    a source region and a drain region of a second conductive type formed in the substrate, and
    a gate structure formed on the active area to define a channel region in the substrate between the drain region and the source region and having a longitudinal axis substantially parallel to the channel direction, wherein the active area has a first side and at least one extension at a second side thereof wherein the first side and the at least one extension of the active region extends along a first direction perpendicular to the channel direction of the channel region, and the extended side is exposed from the gate structure, the active area is within the gate structure and the at least one extension has a first portion which is exposed from the gate structure and a second portion which is not exposed, and the at least one extension has a width, the width is parallel to the channel direction and is shorter than the channel region.

13. The high voltage device as claimed in claim 12, wherein the high voltage device is a MOS transistor.

14. The high voltage device as claimed in claim 12, wherein the substrate further comprises two first well regions of the second conductivity type and the first well region of a second conductivity type formed in the substrate, in which the drain and source regions are formed within the two first well regions respectively and the active area is formed within the second well region.

* * * * *